United States Patent [19]

Sakai et al.

[11] Patent Number: 4,784,701
[45] Date of Patent: Nov. 15, 1988

[54] MULTI-LAYERED THIN FILM SOLAR CELL

[75] Inventors: Hiroshi Sakai, Kanagawa; Seiji Wakamatsu, No. 13-8, Nangai 3-chome, Higashiyamato-shi, Tokyo; Shigeru Ikeda, No. 34-41, Oaza Yatabe, Yatabe-machi, Tsukuba-gun, Ibaragi, all of Japan

[73] Assignees: Fuji Electric Corporate Research and Development Ltd.; Seiji Wakamatsu; Shigeru Ikeda, all of Japan

[21] Appl. No.: 29,682

[22] Filed: Mar. 24, 1987

[30] Foreign Application Priority Data

Mar. 24, 1986 [JP] Japan .................. 61-65341

[51] Int. Cl.$^4$ .............................................. H01L 27/14
[52] U.S. Cl. ..................................... 136/249; 136/244; 136/258; 357/30
[58] Field of Search .......... 136/244, 249 TJ, 258 AM; 357/30 H, 30 J

[56] References Cited

U.S. PATENT DOCUMENTS 4,295,002 10/1981 Chappell et al. .................... 136/244
4,316,049 2/1982 Hanak ................................. 136/244

FOREIGN PATENT DOCUMENTS 56-161081 9/1984 Japan .................. 136/249 TJ
61-075567 4/1986 Japan .................. 136/258 AM

OTHER PUBLICATIONS

J. C. C. Fan et al; *Solar Cells*, vol. 10, pp. 81-98 (1983).

Primary Examiner—Aaron Weisstuch
Attorney, Agent, or Firm—Stevens, Davis, Miller & Mosher

[57] ABSTRACT

A multi-layered thin film solar cell is provided, which includes a substrate, a plurality of transparent electrodes, and a plurality of groups of photoelectric conversion elements formed of semiconductor material and forming successive photoelectric conversion layers. The layers have optical band gaps which decrease successively in a direction away from a side of the cell adapted to receive incident light. The groups of elements forming the layers are laminated on the substrate. Each of the elements belonging to one of the groups is connected in series with one of the elements belonging to another of the groups and is connected in parallel with other elements in the group to which it belongs.

3 Claims, 2 Drawing Sheets

MULTI-LAYERED THIN FILM SOLAR CELL

BACKGROUND OF THE INVENTION

This invention relates to a multi-layered thin film solar cell in which solar light successively enters plural photoelectric conversion layers having different light sensitivities.

For improving the efficiency of a thin film solar cell such as an amorphous silicon type solar cell, effective utilization of the solar light spectrum is indispensable. Since the conversion efficiency is restricted in a thin film solar cell using a single photoelectronic conversion layer, it is necessary to laminate two or more photoelectric conversion layers as shown in FIG. 3 in order to increase the utilization efficiency of the solar light by dividing the sensitivity region to the solar light spectrum. In FIG. 3, for light 10 passing through a light permeable substrate 1 and a transparent electrode 2, the shorter wavelength portion is absorbed by a first photoelectric conversion layer 31 with greater optical band gap (Eg), the longer wavelength portion is absorbed by a third photoelectric conversion layer 33 with smaller optical band gap (Eg), and the medium wavelength portion is absorbed by a second photoelectric conversion layer 32 with an intermediate optical band gap (Eg).

The power of the solar cell having a laminated structure of photoelectric conversion layers of different sensitivity regions is outputted through the transparent electrode 2 and the back electrode 4. It is shown by theoretical calculations that a conversion efficiency of about 20% can be obtained for an amorphous silicon type solar cell and various studies have been made to obtain a multi-layered thin film solar cell.

From a practical point of view, however, the structure shown in FIG. 3, in which a plurality of photoelectric conversion layers are successively laminated on a substrate, has several problems. At first, since each of the photoelectric conversion layers is laminated successively, the device structure has to be designed such that equal electrical currents are generated in each of the photoelectric conversion layers. Further, if the spectrum of the solar light varies depending on the season or site location, design adaptability can no longer be attained and the advantage obtained by adopting the multi-layered structure is reduced due to the non-uniformity of the current. Secondly, since an n-p or p-n junction is formed at the interface between each of the photoelectric conversion layers, recombination loss of carriers occurs or reverse voltage is generated at the junction, causing a reduction in the cell power.

As a countermeasure, a thin film solar cell module as shown in FIG. 4 has been proposed in Japanese Laid Open Pat. No. Sho 60-30163. That is, a group of solar cell units each comprising a laminated transparent electrode 2, a photoelectric conversion layer 31 and a transparent electrode 51 are connected in series on one transparent insulating substrate 1, whereas solar cell units each comprising a metal electrode 4, a photoelectric conversion layer 32 and a transparent electrode 52 are connected in series on the substrate 11. These cell groups are opposed to each other with both of the substrates being on the outside, coupled by way of frames 61 and sealed with transparent resins 62.

Similarly to the case shown in FIG. 3, the optical band gap Eg of the photoelectric conversion layer 31 is greater than that of the photoelectric conversion layer 32. Both of the serially connected solar cells are further connected in parallel with each other by connecting terminals 63 with 64 and terminals 65 with 66, respectively. However, such a module has a drawback that solar cells have to be formed on two substrates separately and the structure is complicated and expensive as well.

SUMMARY OF THE INVENTION

The object of this invention is to provide a multi-layered thin film solar cell which is capable of overcoming the foregoing problems, free from the restriction of equalizing the electric current generated in each of the photoelectric conversion layers and, further, capable of being formed on a single substrate.

The foregoing object can be attained in accordance with this invention by a multi-layered thin film solar cell, comprising groups of photoelectric conversion elements forming photoelectric conversion layers consisting of semiconductors laminated on the substrate, wherein the optical band gaps are successively decreased from the side of light incidence in the laminating direction for more effective utilization of the solar light spectrum, each photoelectric conversion element belonging to one of the groups forming a photoelectric conversion layer is connected in series with a conversion element belonging to another of the groups forming another photoelectric conversion layer and each photoelectric conversion element belonging to one of said groups is connected in parallel with other photoelectric conversion elements in the same group. According to this structure, the solar cell is free from the restriction of equalizing the generated current because elements consisting of the same semiconductor and generating the same current are connected in series.

In the thin film solar cell according to the present invention, respective said groups of the photoelectric conversion elements are successively laminated such that a group is displaced laterally relative to the group lying thereunder by one element at one end of the cell, a transparent electrode is disposed between vertically adjacent photoelectric conversion layers, the electrode at the substrate side of each element is connected to the electrode at the counter-substrate side of the adjacent element in the same group positioned at the other end side of the aforesaid element, and the photoelectric conversion layer of the element at the cell's other end in one of the groups is formed on an extension of the transparent electrode on the substrate side of an element positioned at the cell's other end in the underlying group of elements. In this embodiment, parallel-serial matrix arrangement and connection on one identical substrate can be attained with ease.

BRIEF DESCRIPTION OF THE DRAWINGS

These and other objects, as well as advantageous features of this invention, will become apparent by reading the following description of a preferred embodiment while referring to the accompanying drawings, wherein.

DESCRIPTION OF THE PREFERRED EMBODIMENTS

This invention will now be described by way of its preferred embodiment.

Figure 3:
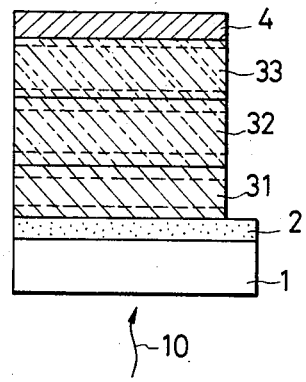
FIG. 3 is a cross sectional view illustrating the structure of a conventional multi-layered type thin film solar cell.
Figure 4:
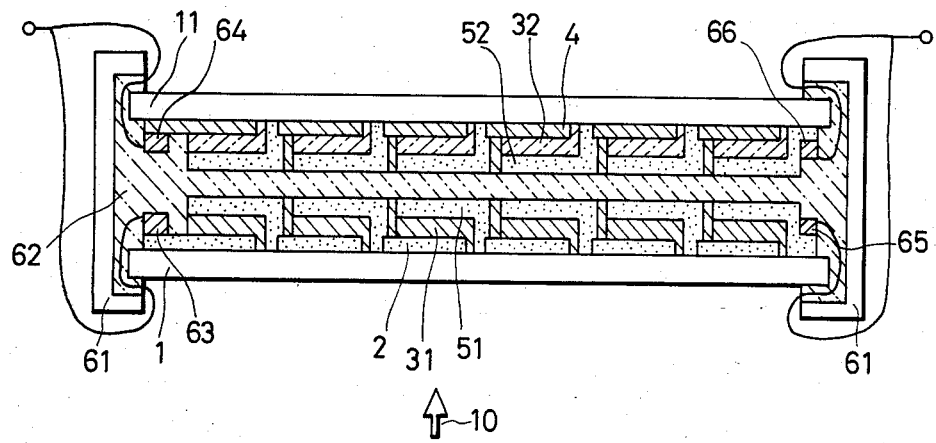
FIG. 4 is a cross sectional view of another conventional example.

FIGS. 1(a) to 1(g) illustrate the manufacturing steps of one embodiment according to this invention, in which the portions identical with those shown in FIGS. 3 and 4 are designated by the same reference numerals.

Figure 1A:
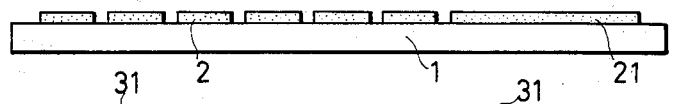
FIGS. 1(a) to 1(g) are cross sectional views illustrating the successively manufacturing steps of a multi-layered solar cell in one embodiment according to this invention.

In FIG. 1(a), a transparent conductive film made of $SnO_2$ or $ITO/SnO_2$ with a thickness from 2,000 to 4,000 Å is formed by electron beam vapor deposition on the entire surface of a glass substrate 1 of 10 cm square and is divided into seven regions, each of 7 to 8 mm width and separated by a gap of 100 μm to 2 mm, by means of a photolithographic process to form transparent electrodes 2. Only the transparent electrode 21 at one end has a width greater than the other electrodes by a factor of three or more.

Figure 1B:
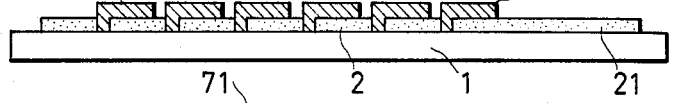

In FIG. 1(b), first photoelectronic conversion layer 31 is formed by the combined use of a glow discharge method, a photo CVD method, etc. The gap between each of the transparent electrodes 2 is filled by layer 31. By means of patterning by a photolithographic process, layer 31 is divided into six photoelectric conversion regions each separated by a gap of 100 μm to 2 mm at the opposite side of electrode 2. The first photoelectric conversion layer 31 is a p i n amorphous silicon film in which a-SiC:H having an Eg of 1.9 eV is used as a p-film.

Figure 1C:
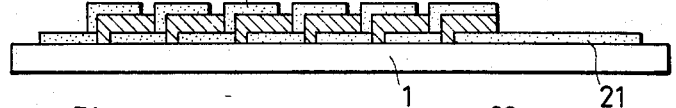

In FIG. 1(c), an ITO film or ZnO film of 4,000 to 6,000 Å thickness is formed over the entire surface, and patterned by a photolithographic process into six intermediate transparent electrodes 71, which are in contact at the ends thereof with the transparent electrodes 2. The intermediate transparent electrode with such an increased thickness can reduce the electric power loss and decrease the deleterious effects on the characteristics. In this way, six photoelectronic conversion elements forming the first photoelectric conversion layer 31 are connected in series with each other.

Figure 1D:
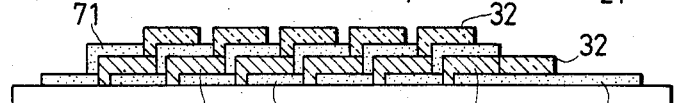

Then, as shown in FIG. 1(d), a second photoelectric conversion layer 32 using a p i n amorphous silicon film with Eg=1.7 eV is deposited over the entire surface and patterned to form six photoelectronic conversion regions except for the upper portion of the first photoelectric conversion layer 31 at the leftmost end in the drawing. The second photoelectric conversion layer 32 at its rightmost end is formed on the transparent electrode 21 while being adjacent to the first photoelectric conversion layer 31 on its rightmost end.

Figure 1E:
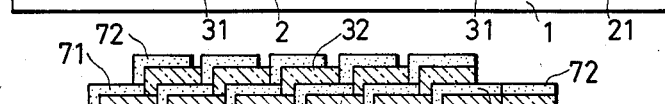

Further, as shown in FIG. 1(e), intermediate transparent electrodes 72 similar to the intermediate transparent electrodes 71 are formed on the second layer and brought into contact with the intermediate transparent electrodes 71.

Figure 1F:
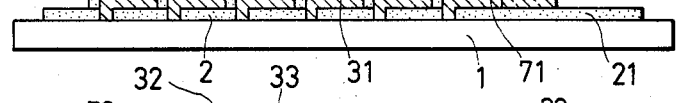

In FIG. 1(f), a third photoelectric conversion layer 33 using an amorphous silicon-germanium alloy film with Eg=1.5 eV is formed in the same manner as the second photoelectric conversion layer 32 while being displaced by one element rightwardly.

Figure 1G:
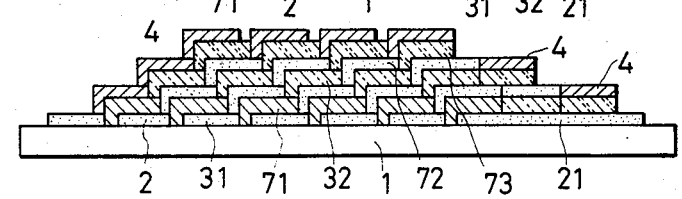
Figure 2:
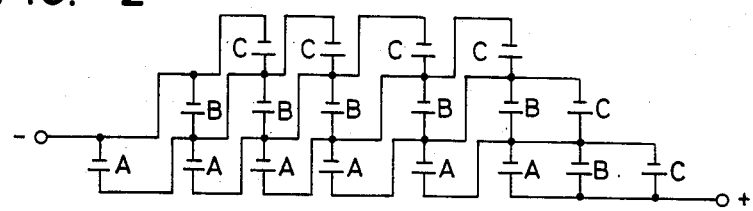
FIG. 2 is an equivalent circuit diagram for the solar cell according to the embodiment of FIGS. 1(a)–1(g)

Finally, as shown in FIG. 1(g), back electrodes 4 are formed by metal deposition and patterning. As a result, as shown by the equivalent circuit in FIG. 2, there is provided a thin film solar cell comprising six photoelectric conversion elements A using the first photoelectric conversion layer 31, six photoelectric conversion elements B using the second photoelectric conversion layer 32, and six photoelectric conversion elements C using the third photoelectric conversion layer 33 connected in parallel and series with each other.

Explanation will now be made as to the result of the comparison between the efficiency of the multi-layered type thin film solar cell according to this invention and the efficiency of the solar cell having a structure as illustrated in FIG. 3.

In the case of a conventional type device as shown in FIG. 3 formed with two layers, that is, a first photoelectric conversion layer with Eg=1.9 eV and a second photoelectric conversion layer with Eg=1.7 eV, if the thickness of the first layer is 2,300 Å and the thickness of the second layer is 7,000 Å, there can be obtained a short circuit electric current density Jsc=8 mA/cm$^2$, an open voltage Voc=1.65 V and an efficiency η=8.58%. On the other hand, according to an embodiment of this invention in which the third photoelectric conversion layer 33 is omitted, Jsc=10 mA/cm$^2$, Voc=0.85 V and η=5.95% in the first layer, Jsc=6 mA/cm$^2$, Voc=0.8 V and η=3.26% in the second layer while selecting the film thickness relatively optionally, and an overall efficiency of 8.84% is obtained. In this way, the efficiency for the entire assembly cannot be expressed as a simple sum unless the voltages between the two layers are not unified. Further, if there is a voltage difference between photoconversion layers of greater than 0.2 V, the effect obtainable by adopting the multi-layered structure is also reduced. However, for a two-layer device of amorphous silicon, the effect of the multi-layered structure according to this invention is significant and the freedom of device design is enhanced. Also, since the p-n junction formed at the interface between the two different photoelectric conversion layers is out of the effective photoelectric conversion region, it does not deleteriously affect the power.

Comparison with the conventional type a device was made for the three-layered structure of the invention as described above. The respective characteristics from the first layer to the third layer were: Voc=0.85 V, Jsc=8 mA/cm$^2$, η=4.76% for the first layer, Voc=0.8 V, Jsc=5 mA/cm$^2$, η=2.72% for the second layer, and Voc=0.76 V, Jsc=5 mA/cm$^2$ and η=2.62% for the third layer, and the overall efficiency of the entire device was η=9.09%. These characteristics are superior to those of the conventional three-layered structure in which Voc=2.31 V, Jsc=6 mA/cm$^2$, η=8.73%. When the total power output per one sunny day were compared by using the two devices as described above, the three-layered device according to this invention showed a better result by 12%.

Although a glass substrate is used in this embodiment, it is of course possible to form the device easily by using a substrate made of stainless steel or flexible polymeric film by reversing the laminating order thereby obtaining similar effects. Further, although the example shows the case of using amorphous silicon type material for constituting the multi-layers, it is of course possible to use polycrystalline and single crystal silicon, as well as Group III-V compounds such as GaAs, InP and AlP, and Group II-VI compounds such as CdS, CdTe and ZnSe, and $CuInSe_2$, etc., may be combined to obtain similar effects.

According to this invention, since groups of photoelectric conversion elements comprising photoelectric conversion layers, the optical band gap of which is decreased successively from the side of light incidence, are laminated on the substrate and connected in a matrix arrangement, it is free from the design restriction of equalizing the optically generated current in the laminating direction and, therefore, respective photoelectric conversion layers having photoelectric regions of different band gaps can be prepared under optically optimum conditions to thereby provide a multi-layered thin film solar cell with high efficiency. In such a matrix arrangement and connection, even if defects, for example, short-circuits due to pinholes in the photoelectric conversion layer occur in a part of the elements, the output power of the entire device is not subject to substantial effects, contrary to the conventional type solar cell.

Great advantages can be obtained by the multi-layered thin film device according to this invention, since each of the elements can easily be connected in a matrix arrangement by laminating photoelectric conversion elements connected in series such that each of the layers is displaced relative to the underlying layer by one element, and since an additional advantage can also be obtained in that electric power can be reliably outputted even in a case where the vertically stacked elements in each of the layers are simultaneously in a non-generating condition due to shadows or the like.

What is claimed is:

1. A multi-layered thin film solar cell, comprising:
a substrate,
a plurality of transparent electrodes, and
a plurality of groups of photoelectric conversion elements formed of semiconductor material and forming successive photoelectric conversion layers, said layers having optical band gaps which decrease successively in a direction away from a side of said cell adapted to receive incident light, said groups of elements forming said layers being laminated on said substrate, each of said elements belonging to one of said groups being (i) connected in series with one of said elements belonging to another of said groups and (ii) connected in parallel with other elements in said one of said groups.

2. A multilayered thin film solar cell as claimed in claim 1, where said successive layers are successively laminated such that at least one of said groups comprises a conversion element disposed at one end of said cell which is displaced laterally by a distance corresponding approximately to a length of one of said conversion elements relative to another of said groups forming a photoelectric conversion layer underlying said one of said groups, one of said transparent electrodes being disposed between vertically adjacent ones of said photoelectric conversion layers such that a said transparent electrode disposed at the substrate side of each of said conversion elements is connected to a said transparent electrode disposed at the counter-substrate side of an adjacent conversion element in the same group located at a side of said each of said conversion elements closest to another end of said cell, and a conversion element located at said other end of said cell in said one of said groups being formed on an extension of the transparent electrode positioned on the substrate side of the conversion element located at said other end of said cell in the underlying one of said groups.

3. A multi-layered thin film solar cell as claimed in claim 1, wherein said substrate is made of a material selected from the group consisting of glass, stainless steel and flexible polymeric film.

* * * * *